United States Patent
Hwang et al.

(10) Patent No.: US 11,537,047 B2
(45) Date of Patent: Dec. 27, 2022

(54) SPIN COATER AND SEMICONDUCTOR FABRICATION METHOD FOR REDUCING REGENERATION OF PHOTORESIST

(71) Applicant: SAMSUNG ELECTRONICS CO., LTD., Suwon-si (KR)

(72) Inventors: Myung-Soo Hwang, Seoul (KR); Kwangsub Yoon, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 335 days.

(21) Appl. No.: 16/803,290

(22) Filed: Feb. 27, 2020

(65) Prior Publication Data
US 2020/0371438 A1 Nov. 26, 2020

(30) Foreign Application Priority Data
May 21, 2019 (KR) .......... 10-2019-0059191

(51) Int. Cl.
| | |
|---|---|
| *G03F 7/16* | (2006.01) |
| *H01L 21/67* | (2006.01) |
| *B05C 11/02* | (2006.01) |
| *B05B 15/50* | (2018.01) |
| *B05B 13/02* | (2006.01) |
| *B05B 15/55* | (2018.01) |
| *B05B 1/24* | (2006.01) |

(52) U.S. Cl.
CPC .......... *G03F 7/162* (2013.01); *B05B 13/0228* (2013.01); *B05B 15/50* (2018.02); *B05B 15/55* (2018.02); *B05C 11/02* (2013.01); *H01L 21/6708* (2013.01); *H01L 21/6715* (2013.01); *H01L 21/67017* (2013.01); *H01L 21/67051* (2013.01); *B05B 1/24* (2013.01)

(58) Field of Classification Search
None
See application file for complete search history.

(56) References Cited

U.S. PATENT DOCUMENTS

| | | | |
|---|---|---|---|
| 4,351,366 A * | 9/1982 | Angioletti | F16L 59/153 138/122 |
| 5,849,084 A * | 12/1998 | Hayes | H01L 21/67017 118/302 |
| 6,247,479 B1 * | 6/2001 | Taniyama | H01L 21/67028 134/133 |
| 8,128,995 B2 | 3/2012 | Park et al. | |
| 10,074,547 B2 | 9/2018 | Tseng et al. | |

(Continued)

FOREIGN PATENT DOCUMENTS

| | | |
|---|---|---|
| KR | 10-2005-0112884 | 12/2005 |
| KR | 10-2006-0131447 | 12/2006 |
| KR | 10-2009-0026929 | 3/2009 |

*Primary Examiner* — Binu Thomas
(74) *Attorney, Agent, or Firm* — F. Chau & Associates, LLC

(57) ABSTRACT

Systems and methods for semiconductor fabrication are described. A spin coater comprises a spin chuck, a nozzle, a nozzle housing, a purge gas supply, and an organic solvent supply. The nozzle housing includes a lower housing including a solvent storage groove in which the organic solvent is stored, and an upper housing on the lower housing. The upper housing includes a nozzle insert hole on the solvent storage groove and receives the nozzle, and a gas supply hole connected to one side of the nozzle insert hole.

11 Claims, 7 Drawing Sheets

(56) References Cited

U.S. PATENT DOCUMENTS

| | | | |
|---|---|---|---|
| 2008/0251107 A1* | 10/2008 | Osada | H01L 21/67051 134/201 |
| 2011/0068200 A1* | 3/2011 | Kim | H01L 21/67051 239/589 |
| 2011/0240601 A1* | 10/2011 | Hashizume | H01L 21/67051 156/345.23 |
| 2013/0020284 A1* | 1/2013 | Osada | H01L 21/67051 156/345.21 |
| 2013/0224956 A1* | 8/2013 | Negoro | H01L 21/67023 118/641 |
| 2018/0219188 A1 | 8/2018 | Mine et al. | |
| 2018/0304297 A1 | 10/2018 | Dan | |
| 2020/0038897 A1* | 2/2020 | Kamimura | B05B 1/3093 |
| 2020/0070196 A1* | 3/2020 | Kamimura | H01L 21/67017 |

* cited by examiner

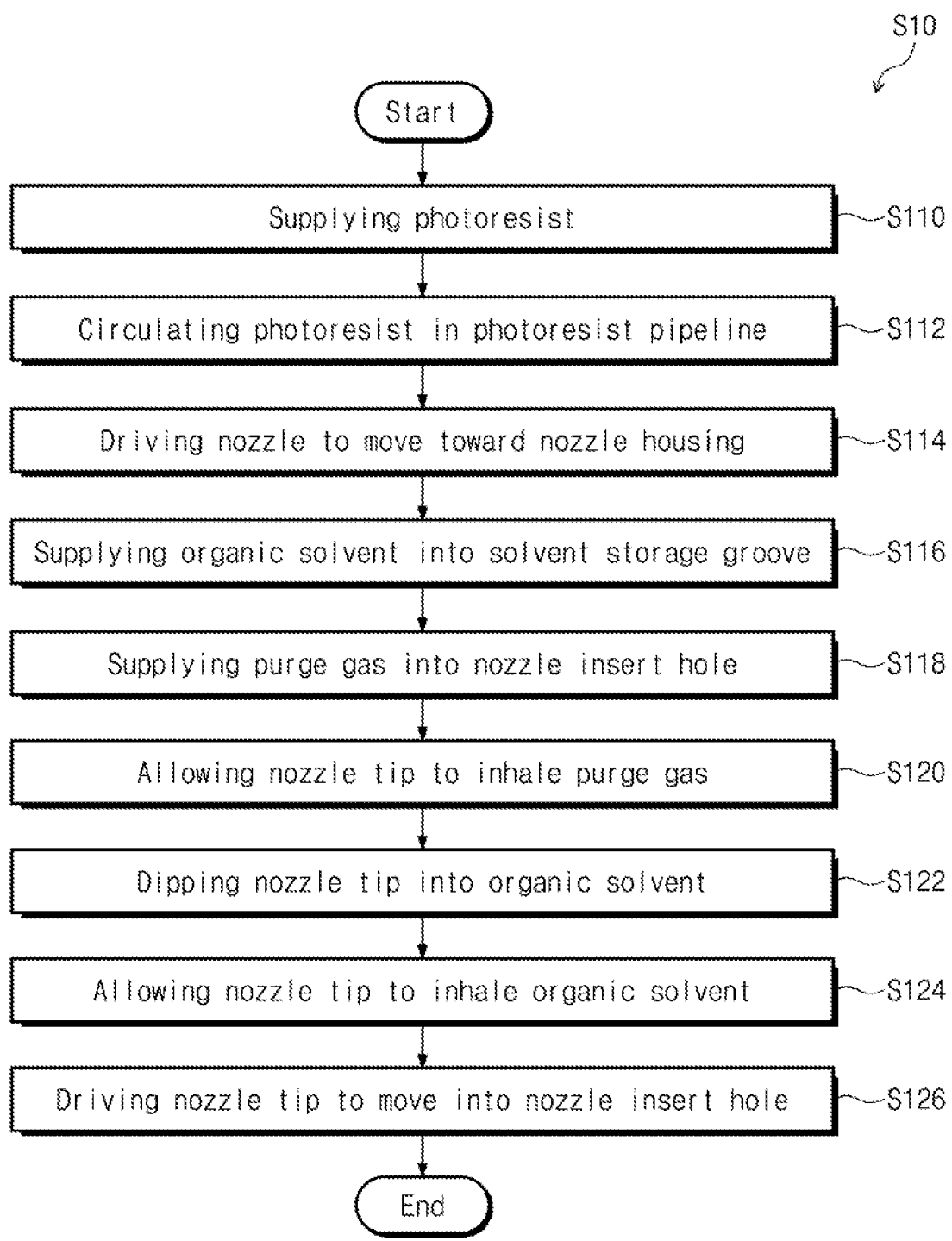

SPIN COATER AND SEMICONDUCTOR FABRICATION METHOD FOR REDUCING REGENERATION OF PHOTORESIST

CROSS-REFERENCE TO RELATED APPLICATION

This U.S. nonprovisional application claims priority under 35 U.S.C § 119 to Korean Patent Application No. 10-2019-0059191 filed on May 21, 2019 in the Korean Intellectual Property Office, the entire contents of which are hereby incorporated by reference.

BACKGROUND

The present inventive concepts relate to a semiconductor fabrication apparatus and method, more particularly, to a spin coater that coats a photoresist on a substrate and a semiconductor fabrication method using the same.

A semiconductor device is a component of an electric circuit. A multitude of applications use semiconductor devices, such as smart phones, tablet computers, and cameras. Manufacturing of semiconductor devices involves multiple processes, such as film deposition, photolithograph, etching, and cleaning. Photolithography in particular is the process of fabricating a thin film for semiconductor devices, using light and light sensitive material to create micro patterns. Specifically, a photoresist material may be used to create the micro patterns on a film.

Moisture present in a photolithography apparatus can contribute to unwanted deterioration of the photoresist. Therefore, there is a need in the art to reduce the moisture levels associated with a photoresist in the photolithography to produce more dependable micro patterns on thin films.

SUMMARY

Some example embodiments of the present inventive concepts provide a spin coater which is capable of minimizing or preventing deterioration of photoresist and a semiconductor fabrication method using the same.

According to some example embodiments of the present inventive concepts, a spin coater may comprise: a spin chuck that rotates a substrate; a nozzle that provides a photoresist on the substrate; a nozzle housing configured to receive the nozzle; a purge gas supply that supplies a purge gas into the nozzle housing; and a solvent supply that supplies a solvent into the nozzle housing. The nozzle housing may include: a lower housing including a solvent storage groove in which the solvent is stored; and an upper housing on the lower housing. The upper housing may include: a nozzle insert hole above the solvent storage groove and configured to receive the nozzle; and a gas supply hole connected to one side of the nozzle insert hole.

According to some example embodiments of the present inventive concepts, a spin coater may comprise: a spin chuck that rotates a substrate; a nozzle that provides a photoresist on the substrate; a photoresist supply that provides the nozzle with the photoresist; and a photoresist pipeline that connects the nozzle to the photoresist supply.

The photoresist pipeline may include: an external line; an internal line in the external line; and a filler between an inner wall of the external line and an outer wall of the internal line, the filler containing a purge gas.

According to some example embodiments of the present inventive concepts, a semiconductor fabrication method may comprise: coating a photoresist on a substrate; heating the substrate to cure the photoresist; exposing the photoresist to light; and developing the photoresist to form a photoresist pattern. The step of coating the photoresist may include: providing the photoresist on the substrate by supplying the photoresist to a nozzle connected to a photoresist pipeline; driving the nozzle to move toward the nozzle housing; supplying a solvent into a solvent storage groove of a lower housing of the nozzle housing; supplying a purge gas into a nozzle insert hole of an upper housing on the lower housing; allowing a tip of the nozzle to inhale the purge gas; and allowing the tip of the nozzle to inhale the solvent.

According to some example embodiments of the present inventive concepts, a method of manufacturing a semiconductor may include coating a substrate with a photoresist using a nozzle; moving the nozzle into a nozzle housing after coating the substrate with the photoresist; supplying a solvent into the nozzle housing; supplying a purge gas into the nozzle housing; and drawing a portion of the solvent, a portion of the purge gas, or both into the nozzle from the nozzle housing.

BRIEF DESCRIPTION OF THE DRAWINGS

FIG. 7 illustrates a flow chart showing an example of a photoresist coating step of FIG. 6.

DETAILED DESCRIPTION OF EMBODIMENTS

The present disclosure relates to systems and methods for photolithography. Photolithography may include a photoresist coating process, a baking process, an exposure process, and a development process. The photoresist coating process may include a step in which droplets are provided onto a substrate and a process in which the substrate is rotated to coat photoresist on the entire surface of the substrate. A spinning apparatus may be utilized to perform the dropping and substrate spin steps of the photoresist coating process.

The photoresist may include an organic photoresist or an inorganic photoresist. Organic photoresist may be exposed to ultraviolet (UV) light, using a Krypton Fluoride (KrF) laser or an Argon Fluoride (ArF) laser. Inorganic photoresist may be exposed to extreme ultraviolet (EUV) light. The inorganic photoresist may contain nano-sized metal particles that can be oxidized when exposed to atmospheric moisture.

Accordingly, minimal exposure to atmosphere may be desirable when using inorganic photoresist. Specifically, moisture may interact with fluoropolymer tubes that provides the inorganic photoresist. Thus, according to embodiments of the present disclosure, a purge gas is circulated in a photoresist pipe to minimize the deterioration of the photoresist.

Figure 1:
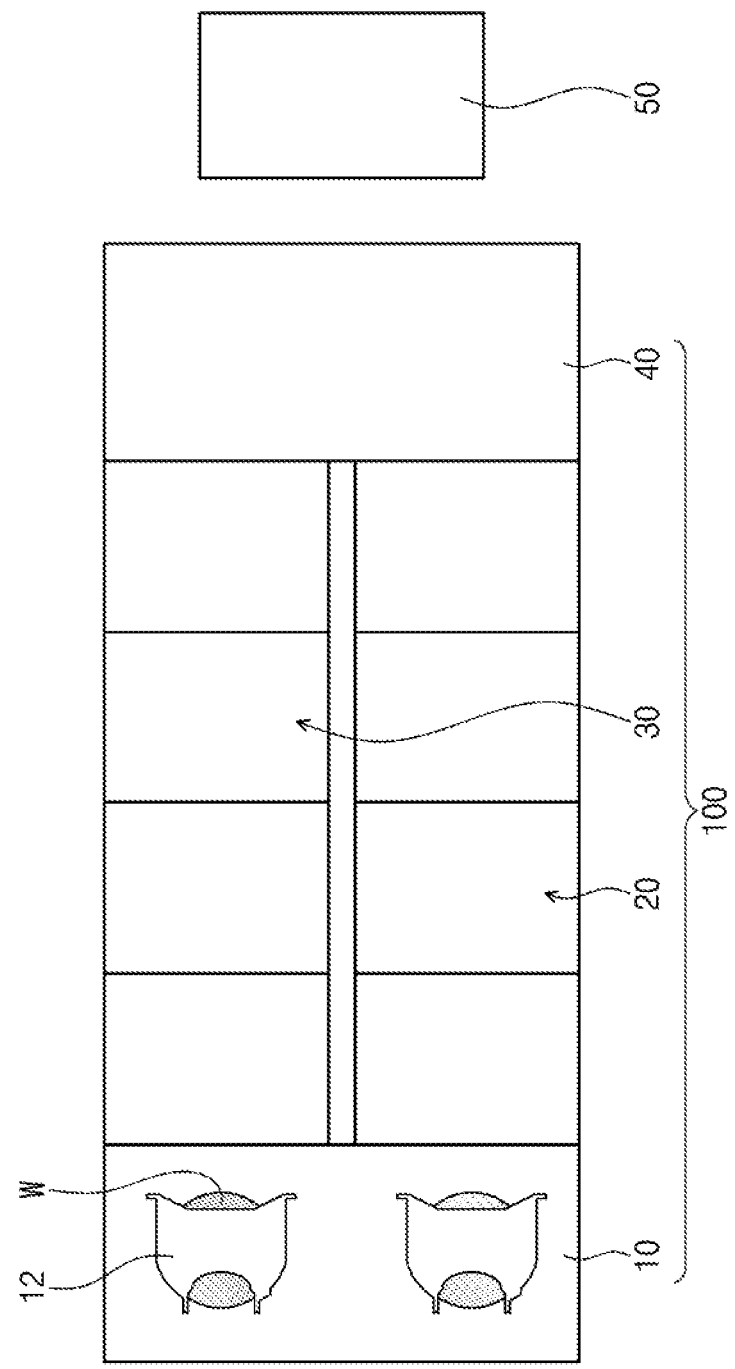
FIG. 1 illustrates a plan view showing a semiconductor fabrication apparatus according to the present inventive concepts.

FIG. 1 shows a semiconductor fabrication apparatus 100 according to the present inventive concepts.

In some examples, a spinner may be used within a semiconductor fabrication apparatus 100 according to the present inventive concepts. The present inventive concepts, however, are not limited thereto. The semiconductor fabrication apparatus 100 may include, for example, an indexer 10, a spin coater 20, a baker 30, and a developer 40. The indexer 10 may provide the spin coater 20 with a substrate W in a carrier 12. The spin coater 20 may coat a photoresist (see photoresist 22 of FIG. 2) on the substrate W. The baker 30 may heat the substrate W to cure the photoresist 22. An exposer 50 may be provided adjacent to the developer 40. The exposer 50 may allow light to expose a portion of the photoresist 22 on the substrate W. The developer 40 may develop the photoresist 22 to form a photoresist pattern on the substrate W. The substrate W may be reloaded into the carrier 12.

Figure 2:
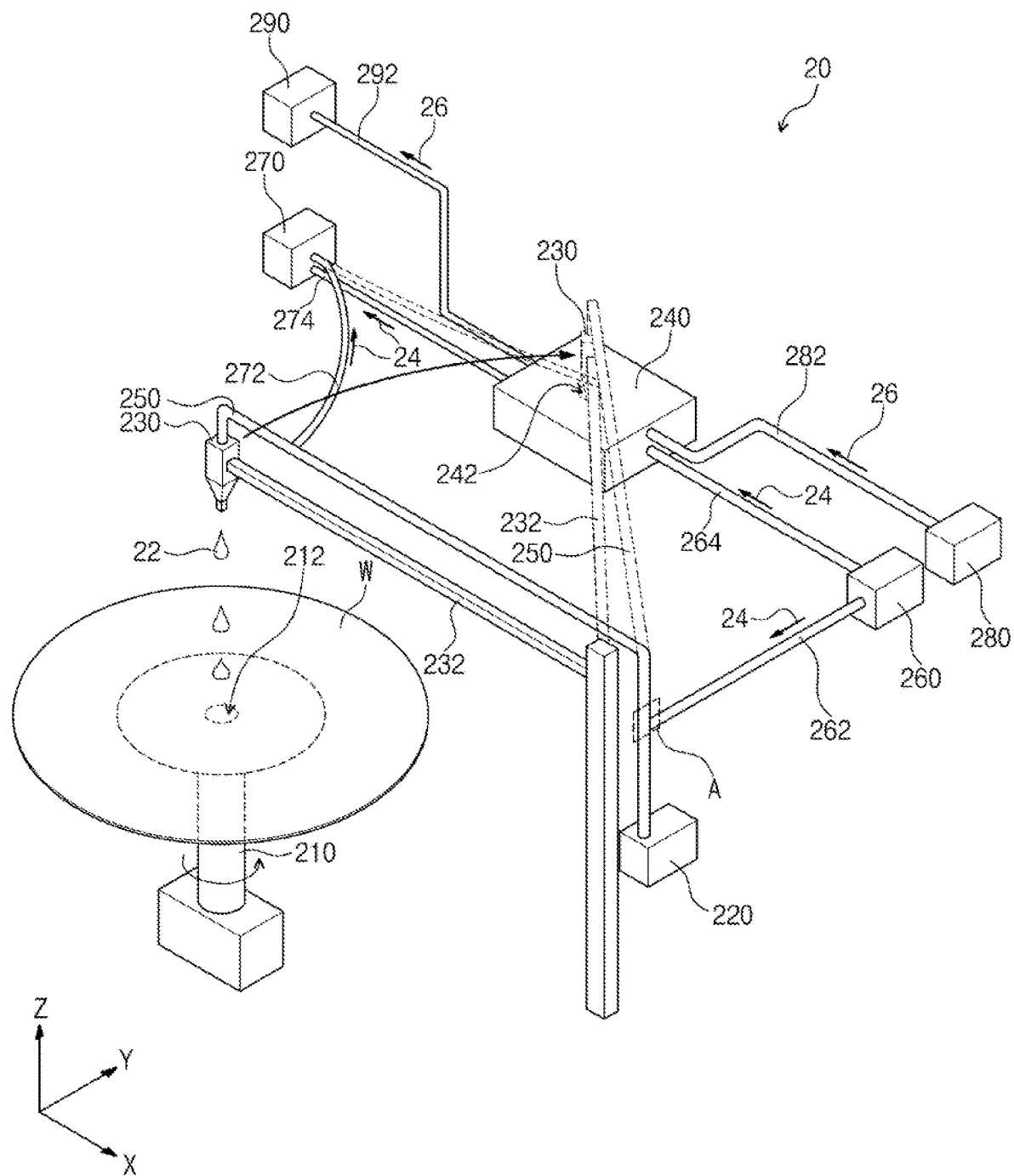
FIG. 2 illustrates a perspective view showing an example of a spin coater depicted in FIG. 1.

FIG. 2 shows an example of the spin coater 20 illustrated in FIG. 1.

Referring to FIG. 2, the spin coater 20 may include a spin chuck 210, a photoresist supply 220, a nozzle 230, a nozzle housing 240, a photoresist pipeline 250, a purge gas supply 260, a purge gas exhauster 270, an organic solvent supply 280, and an organic solvent discharger 290.

The substrate W may be loaded on the spin chuck 210. The spin chuck 210 may have a vacuum hole 212. The vacuum hole 212 may be disposed to face a bottom surface of the substrate W. The substrate W may be rigidly held on the spin chuck 210 when a vacuum is created in the vacuum hole 212. The spin chuck 210 may rotate the substrate W and coat the photoresist 22 on an entire top surface of the substrate when a photoresist 22 is provided on a center of the substrate W. For example, the spin chuck 210 may drive the substrate W to rotate at about 1000 rpm to about 1600 rpm. A centrifugal force may force the photoresist 22 to spread from center to edge of the substrate W.

The photoresist supply 220 may supply the photoresist 22 to the photoresist pipeline 250 and the nozzle 230. Additionally, the photoresist supply 220 may store the photoresist 22. For example, the photoresist supply 220 may include a bottle or a reservoir. Additionally, the photoresist supply 220 may include a flow control valve that controls a supply flow rate of the photoresist 22, but the present inventive concepts are not limited thereto.

The nozzle 230 may be associated with a nozzle arm 232. Additionally, the nozzle arm 232 may be installed adjacent to the spin chuck 210 and may provide the nozzle 230 onto the spin chuck 210. The nozzle 230 may provide the photoresist 22 onto the center of the substrate W. For example, the substrate W may be provided thereon with the photoresist 22 in the form of a drop or droplet. In addition, during idle time, the nozzle arm 232 may drive the nozzle 230 to move toward the nozzle housing 240.

The nozzle housing 240 may be installed on one side of the spin chuck 210. The nozzle housing 240 may receive the nozzle 230. The nozzle housing 240 may have a nozzle insert hole 242. The nozzle 230 may be provided into the nozzle insert hole 242.

The photoresist pipeline 250 may connect the nozzle 230 with the photoresist supply 220. Additionally, the photoresist pipeline 250 may transfer the photoresist 22 from the photoresist supply 220 to the nozzle 230 and may be opaque to protect the photoresist 22 from external light. When the photoresist pipeline 250 is opaque, the photoresist 22 may be minimized or prevented from photosensitization. For example, the photoresist 22 may include an organic photoresist or an inorganic photoresist. The organic photoresist may be used for an ultraviolet (UV) exposure process in which a KrF or ArF light source is employed. The inorganic photoresist may be used for an extreme ultraviolet (EUV) exposure process. For example, the inorganic photoresist may be a metallic photoresist. The inorganic photoresist may include nano-sized metal particles. The seal of the photoresist pipeline 250 and the nozzle 230 may be tight due to metal particles combining with atmospheric moisture to deteriorate the inorganic photoresist.

Figure 3:
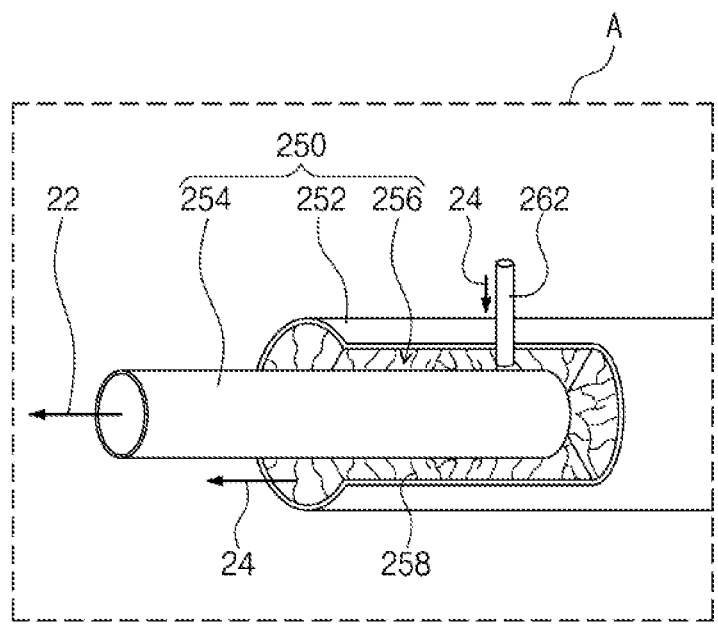
FIG. 3 illustrates an enlarged view showing section A of FIG. 2.

FIG. 3 illustrates an enlarged view showing section A of FIG. 2.

Referring to FIG. 3, the photoresist pipeline 250 may be a double tube or a double line. For example, the photoresist pipeline 250 may include an external line 252, an internal line 254, and a filler 256.

The external line 252 may encapsulate the internal line 254 and the filler 256. The external line 252 may protect the internal line 254 and the filler 256 against an external environment. The external line 252 may include a tube made of fluoropolymer, such as perfluoroalkoxy (PFA).

The internal line 254 may be disposed in the external line 252. The photoresist 22 may be provided into the internal line 254 and the internal line 254 may be chemically resistant to the photoresist 22. Additionally, the internal line 254 may be formed of the same material as that of the external line 252. For example, the internal line 254 may include a tube made of fluoropolymer, such as perfluoroalkoxy (PFA).

The filler 256 may be disposed between an outer wall of the internal line 254 and an inner wall of the external line 252. For example, the filler 256 may include a porous polymer of polyurethane foam resin. The filler 256 may have one or more pores 258. When the photoresist pipeline 250 is bent, the filler 256 may uniformly maintain a distance between the outer wall of the internal line 254 and the inner wall of the external line 252. Alternatively, the filler 256 may reduce heat transfer between atmospheric air and the photoresist 22 present in the internal line 254.

Referring to FIG. 2, the purge gas supply 260 may be associated with the photoresist pipeline 250 and the nozzle housing 240. The purge gas supply 260 may supply a purge gas 24 into the photoresist pipeline 250 and the nozzle housing 240. The purge gas 24 may include, for example, a nitrogen ($N_2$) gas. Alternatively, the purge gas 24 may include an argon (Ar) or helium (He) gas, but the present inventive concepts are not limited thereto.

The purge gas exhauster 270 may be associated with the photoresist pipeline 250 and the nozzle housing 240. Additionally, the purge gas exhauster 270 may exhaust the purge gas 24 from the photoresist pipeline 250 and the nozzle housing 240. As a result, the purge gas 24 may circulate in each of the photoresist pipeline 250 and the nozzle housing 240. The purge gas 24 may minimize or prevent deterioration of the photoresist 22. The following example will describe purge gas 24 circulation in the photoresist pipeline 250 and the nozzle housing 240.

First, the purge gas supply 260 and the purge gas exhauster 270 may force the purge gas 24 to circulate in the photoresist pipeline 250, and therefore the photoresist 22 in the photoresist pipeline 250 may be protected from atmospheric moisture.

A first supply line 262 may be connected between the photoresist pipeline 250 and the purge gas supply 260. The photoresist pipeline 250 may be connected to the first supply line 262 at its portion adjacent to the photoresist supply 220. The first supply line 262 may provide the purge gas 24 into the photoresist pipeline 250. For example, the purge gas 24 may be provided into a gap between the inner wall of the external line 252 and the outer wall of the internal line 254.

Referring to FIG. 3, the first supply line 262 may be connected to the external line 252 and may extend to the filler 256 in the external line 252. The first supply line 262 may be separated from the internal line 254. The purge gas 24 may be provided into the filler 256 when the purge gas supply 260 supplies the purge gas 24 through the first supply line 262. The purge gas 24 may flow along the pores 258 of the filler 256. Additionally, the purge gas 24 may fill a gap between the inner wall of the external line 252 and the outer wall of the internal line 254. For example, the filler 256 may contain the purge gas 24.

Referring again to FIG. 2, a first discharge line 272 may be connected between the photoresist pipeline 250 and the purge gas exhauster 270. The photoresist pipeline 250 may be connected to the first discharge line 272 at a location adjacent to the nozzle 230. Although not shown, the first discharge line 272 may be connected to the external line 252 and the first discharge line 272 may be separated from the internal line 254. The first discharge line 272 may exhaust the purge gas 24 from the photoresist pipeline 250 to the purge gas exhauster 270. The purge gas 24 may circulate along the pores 258 in the photoresist pipeline 250. The circulating purge gas 24 may remove atmospheric moisture introduced into the photoresist pipeline 250, preventing deterioration of the photoresist 22. An ordinary single-layered photoresist pipeline may be configured such that atmospheric moisture is introduced thereinto through pores. In contrast, the photoresist pipeline 250 may be configured such that the purge gas 24 between the inner wall of the external line 252 and the outer wall of the internal line 254 may be used to suppress the introduction of atmospheric moisture. Therefore, deterioration of the photoresist 22 may be prevented.

In addition, the purge gas supply 260 and the purge gas exhauster 270 may force the purge gas 24 to circulate in the nozzle housing 240. Therefore, the photoresist 22 in the nozzle 230 may be protected from atmospheric moisture.

A second supply line 264 may be connected between the purge gas supply 260 and the nozzle housing 240, and a second discharge line 274 may be connected between the purge gas exhauster 270 and the nozzle housing 240. The second supply line 264 may provide the purge gas 24 into the nozzle housing 240, and the second discharge line 274 may discharge the purge gas 24 from the nozzle housing 240. The purge gas 24 may circulate in the nozzle housing 240. The circulating purge gas 24 may remove atmospheric moisture from the nozzle housing 240. Therefore, deterioration of the photoresist 22 may be prevented.

Further, the organic solvent supply 280 and the organic solvent discharger 290 may force an organic solvent 26 to circulate in the nozzle housing 240. Therefore, the photoresist 22 may be protected from atmospheric moisture. For example, the organic solvent 26 may include benzene, ether, acetone, or alcohol, but the present inventive concepts are not limited thereto.

The organic solvent supply 280 may be associated with one side of the nozzle housing 240. Additionally, the organic solvent supply 280 may supply the organic solvent 26 into the nozzle housing 240. A third supply line 282 may be connected between the organic solvent supply 280 and the nozzle housing 240. The third supply line 282 may provide the organic solvent 26 into the nozzle housing 240.

The organic solvent discharger 290 may be associated with a different side of the nozzle housing 240. Additionally, the organic solvent discharger 290 may discharge the organic solvent 26 from the nozzle housing 240. A third discharge line 292 may be connected between the organic solvent discharger 290 and the nozzle housing 240. The third discharge line 292 may discharge the organic solvent 26 from the nozzle housing 240 to the organic solvent discharger 290.

Figure 4:
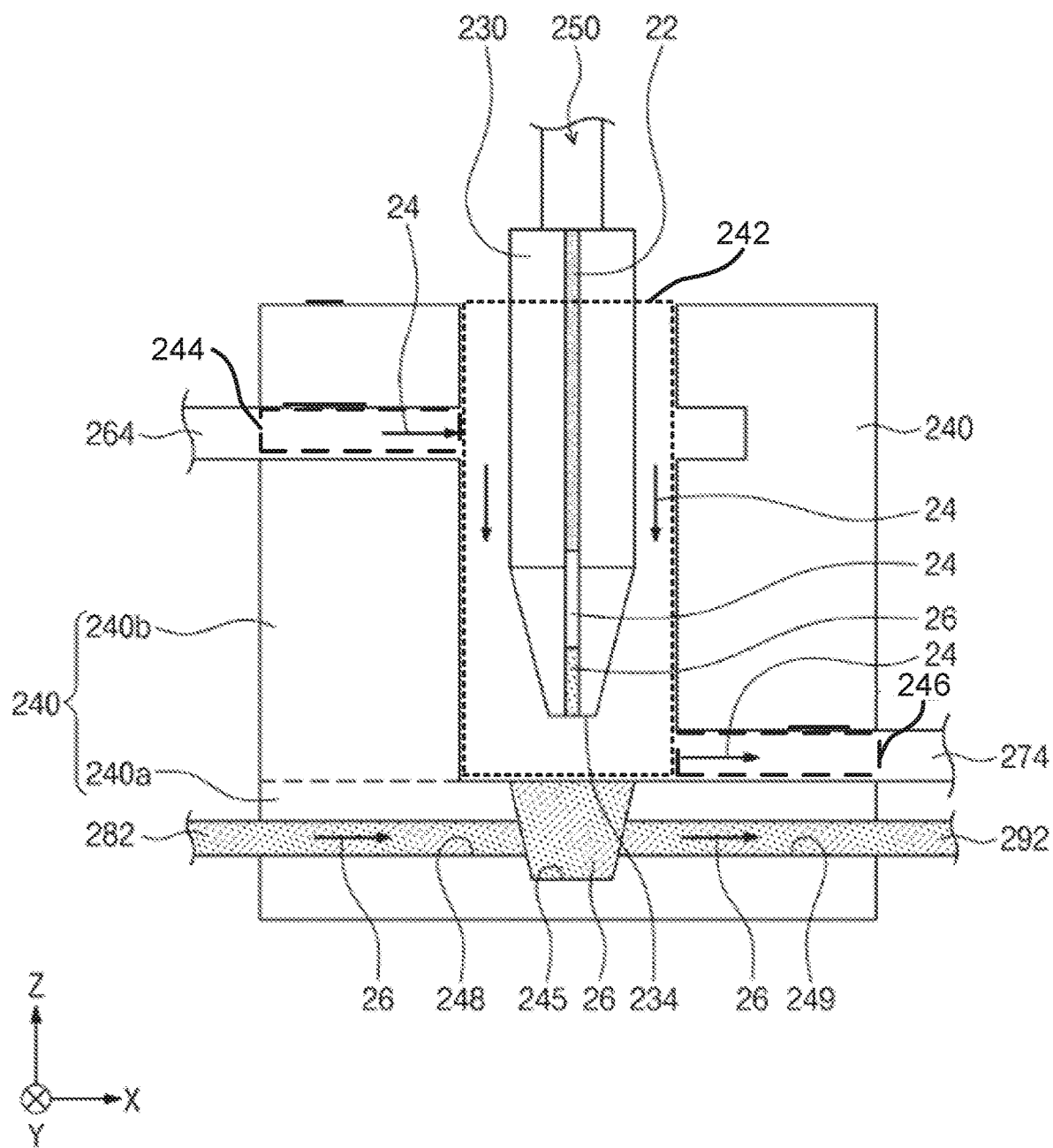
FIG. 4 illustrates a cross-sectional view showing an example of a nozzle housing depicted in FIG. 2.

FIG. 4 shows an example of the nozzle housing 240 illustrated in FIG. 2.

Referring to FIG. 4, the nozzle housing 240 may include a lower housing 240a and an upper housing 240b.

The lower housing 240a may store the organic solvent 26. For example, the lower housing 240a may have a solvent storage groove 245, a solvent supply hole 248, and a solvent discharge hole 249.

The solvent storage groove 245 may store the organic solvent 26. Additionally, the solvent supply hole 248 may be associated with the organic solvent supply 280 and the organic solvent 26 may be supplied through the solvent supply hole 248 into the solvent storage groove 245. The solvent discharge hole 249 may be associated with the organic solvent discharger 290. The organic solvent 26 may be discharged from the solvent storage groove 245 to the organic solvent discharger 290, through the solvent discharge hole 249.

The upper housing 240b may be disposed on the lower housing 240a. For example, the upper housing 240b may have a nozzle insert hole 242, a gas supply hole 244, and a gas discharge hole 246.

The nozzle insert hole 242 may be disposed on the solvent storage groove 245 and may expose the solvent storage groove 245. A tip 234 of the nozzle 230 received in the nozzle insert hole 242 may be close to or provided in the organic solvent 26 stored in the solvent storage groove 245. The nozzle insert hole 242 may have a diameter larger than or equal to that of the solvent storage groove 245. When the nozzle 230 is provided into the nozzle insert hole 242, the photoresist supply 220 may provide the nozzle 230 with pumping pressure to allow the tip 234 of the nozzle 230 to inhale the purge gas 24 and the organic solvent 26. The purge gas 24 and the organic solvent 26 in the tip 234 may protect the photoresist 22 against atmospheric moisture.

The gas supply hole 244 may be connected to one side of the nozzle insert hole 242. Additionally, the gas supply hole 244 may be connected to the second supply line 264 and the gas supply hole 244 may be disposed on the solvent supply hole 248. The gas supply hole 244 may be connected to an upper portion of the nozzle insert hole 242. The purge gas 24 may be provided through the gas supply hole 244 into the nozzle insert hole 242.

The gas discharge hole 246 may be connected to a different side of the nozzle insert hole 242. Additionally, the gas discharge hole 246 may be connected to the second discharge line 274 and may be connected to a lower portion of the nozzle insert hole 242. The gas discharge hole 246 may be disposed on the solvent discharge hole 249.

The purge gas 24 in the nozzle insert hole 242 may be discharged through the gas discharge hole 246. Additionally, the purge gas 24 may circulate in the nozzle insert hole 242 between the gas supply hole 244 and the gas discharge hole 246 and may circulate from the upper portion to the lower portion of the nozzle insert hole 242. The purge gas 24 may circulate in a direction the same as a forward direction of the tip 234. The circulating purge gas 24 may protect the photoresist 22 from atmospheric moisture in the nozzle insert hole 242 and the nozzle 230.

Figure 5:
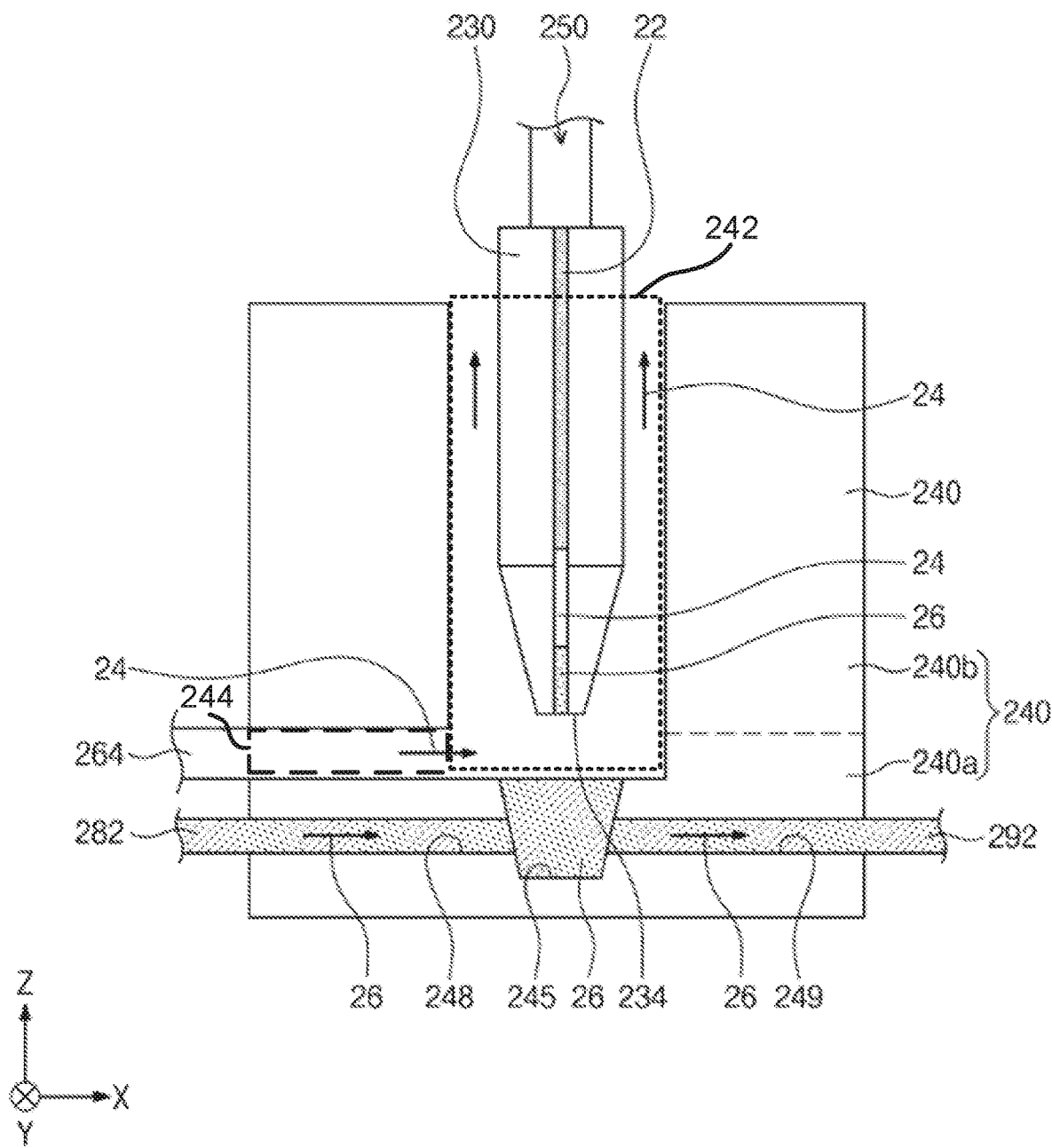
FIG. 5 illustrates a cross-sectional view showing another example of a nozzle housing depicted in FIG. 2.

FIG. 5 shows another example of the nozzle housing 240 illustrated in FIG. 2.

Referring to FIG. 5, the gas supply hole 244 of the nozzle housing 240 may be disposed on a lower portion of the upper housing 240b. The gas supply hole 244 may be disposed adjacent to the lower housing 240a. The gas supply hole 244 may provide the purge gas 24 to the tip 234 of the nozzle 230. The purge gas 24 may flow from the tip 234 of the nozzle 230 toward a top surface of the upper housing 240b. The lower housing 240a may be configured identically to that discussed with reference to FIG. 4.

It will be described below a semiconductor fabrication method using the spin coater 20 configured as describe above.

Figure 6:
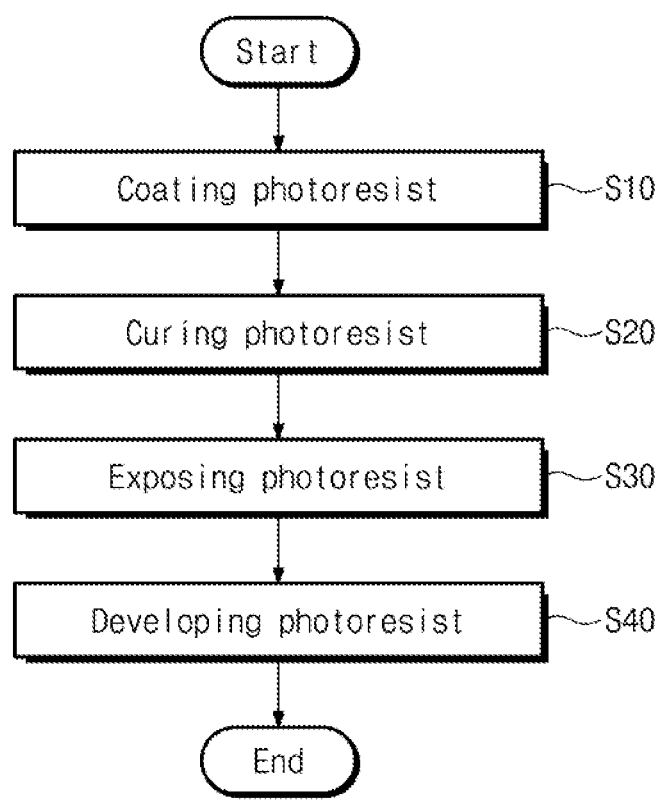
FIG. 6 illustrates a flow chart showing a semiconductor fabrication method according to the present inventive concepts.

FIG. 6 shows a flow chart showing a semiconductor fabrication method according to the present inventive concepts.

Referring to FIG. 6, a semiconductor fabrication method according to the present inventive concepts may include a step S10 of coating the photoresist 22, a step S20 of curing the photoresist 22, a step S30 of exposing the photoresist 22, and a step S40 of developing the photoresist 22.

First, the spin coater 20 may coat the photoresist 22 on a top surface of the substrate W (S10). The photoresist 22 may include an inorganic photoresist. Alternatively, the photoresist 22 may include an organic photoresist.

FIG. 7 illustrates a flow chart showing an example of the photoresist coating step S10 of FIG. 6.

Referring to FIGS. 2 and 7, a process of coating the photoresist 22 (S10) may include supplying the photoresist 22 (S110), circulating the purge gas 24 in the photoresist pipeline 250 (S112), and driving the nozzle 230 to move toward the nozzle housing 240 (S114). Additionally, the process of coating the photoresist 22 (S10) may include supplying the organic solvent 26 into the solvent storage groove 245 (S116), supplying the purge gas 24 into the nozzle insert hole 242 (S118), and allowing the tip 234 of the nozzle 230 to inhale the purge gas 24 (S120). The process of coating the photoresist 22 (S10) may also include dipping the tip 234 of the nozzle 230 into the organic solvent 26 (S122), allowing the tip 234 of the nozzle 230 to inhale the organic solvent 26 (S124), and driving the tip 234 of the nozzle 230 to move into the nozzle insert hole 242 on the solvent storage groove 245 (S126).

When the nozzle 230 is provided on the substrate W on the spin chuck 210, the photoresist supply 220 may supply the nozzle 230 with the photoresist 22 (S110). The nozzle 230 may drop the photoresist 22 on the substrate W. The spin chuck 210 may drive the substrate W to rotate to coat the photoresist 22 on an entire top surface of the substrate W.

The purge gas supply 260 and the purge gas exhauster 270 may then circulate the purge gas 24 in the photoresist pipeline 250 (S112). The circulating purge gas 24 may remove atmospheric moisture introduced into the photoresist pipeline 250. Therefore, deterioration of the photoresist 22 may be prevented or minimized. Alternatively, the photoresist pipeline 250 may be filled with the purge gas 24.

During idle time, the nozzle arm 232 may drive the nozzle 230 to move toward the nozzle housing 240 (S114). The nozzle arm 232 may pivot in a second direction Y from a first direction D1. For example, the nozzle arm 232 may pivot in a direction away from the spin chuck 210. Therefore, the nozzle 230 may move toward the nozzle housing 240. The nozzle arm 232 may move up and down in a third direction Z. The nozzle 230 may be inserted into the nozzle insert hole 242 of the nozzle housing 240.

The organic solvent supply 280 may supply the organic solvent 26 into the solvent storage groove 245 (S116). The organic solvent discharger 290 may discharge the organic solvent 26 from the solvent storage groove 245, thereby circulating the organic solvent 26.

After that, the purge gas supply 260 may supply the nozzle housing 240 with the purge gas 24 (S118). The purge gas 24 may be provided into the tip 234 of the nozzle 230 in the upper housing 240b. The purge gas exhauster 270 may exhaust the purge gas 24 from the nozzle insert hole 242 of the upper housing 240b, thereby circulating the purge gas 24.

Thereafter, the photoresist supply 220 may provide the nozzle 230 with pumping pressure to allow the tip 234 of the nozzle 230 to inhale the purge gas 24 (S120). The purge gas 24 may protect the photoresist 22 in the tip 234 against atmospheric moisture.

The nozzle arm 232 may dip the tip 234 of the nozzle 230 into the organic solvent 26 (S122). The nozzle arm 232 may descend in the third direction Z to dip the tip 234 of the nozzle 230 into the organic solvent 26 in the solvent storage groove 245.

The photoresist supply 220 may then provide pumping pressure to allow the tip 234 of the nozzle 230 to inhale the organic solvent 26 (S124).

Last, the nozzle arm 232 may ascend in the third direction Z to drive the tip 234 of the nozzle 230 to move into the nozzle insert hole 242 on the solvent storage groove 245 (S126). The organic solvent 26 may protect the purge gas 24 and the photoresist 22 in the tip 234 of the nozzle 230. The purge gas 24 and the organic solvent 26 may protect, from atmospheric moisture, the photoresist 22 in the tip 234 of the nozzle 230.

Referring to FIG. 6, the baker 30 may heat the wafer W to cure the photoresist 22 (S20). A soft baking process at a first temperature, and a hard baking process at a second temperature higher than the first temperature, may be used to cure the photoresist 22. A hard baking process, at a second temperature larger than the first temperature. Thereafter, the exposer 50 may be provided with the substrate W.

The exposer 50 may cause the photoresist 22 to undergo exposure along a reticle mask pattern or to one of extreme ultraviolet (EUV) or ultraviolet (UV) rays (S30). The developer 40 may develop the photoresist 22 to form a photoresist pattern on the substrate W (S40). The substrate W may be loaded in the carrier 12 on the indexer 10.

Thus, according to some example embodiments of the present inventive concepts, a method of manufacturing a semiconductor may include coating a substrate W with a photoresist 22 using a nozzle 230; moving the nozzle 230 into a nozzle housing 240 after coating the substrate with the photoresist; supplying a solvent into the nozzle housing 240; supplying a purge gas 24 into the nozzle housing 240; and drawing a portion of the solvent, a portion of the purge gas 24, or both into the nozzle 230 from the nozzle housing 240.

The method may further include moving the nozzle 230 to a first position located above a spin chuck 210, wherein the substrate W is loaded on the spin chuck 210; and moving the nozzle 230 from the first position to a second position located above the nozzle housing 240 prior to moving the nozzle into the nozzle housing 240. In some cases, the method may further include moving the nozzle 230 from the second position back to the first position; and coating a subsequent substrate W with the photoresist 22.

Therefore, a purge gas supply 260 of a spin coater 20 according to some embodiments of the present inventive concepts may be configured such that a photoresist pipeline 250 and a nozzle 230 are provided with a purge gas 24 to minimize or prevent a photoresist 22 from deterioration caused by exposure to atmospheric moisture.

Although the present disclosure has been described in connection with the embodiments of the present disclosure illustrated in the accompanying drawings, it will be understood to those skilled in the art that various changes and modifications may be made without departing from the technical spirit and features of the present disclosure. Therefore, it will be understood that the embodiments described above are just illustrative but not limitative in all aspects.

What is claimed is:

1. A spin coater, comprising:
a spin chuck that rotates a substrate;
a nozzle that provides a photoresist on the substrate;
a nozzle housing configured to receive the nozzle;
a purge gas supply that supplies a purge gas into the nozzle housing; and
a solvent supply that supplies a solvent into the nozzle housing;
a purge gas exhauster that exhausts the purge gas from the nozzle housing;
a photoresist supply that provides the photoresist into the nozzle; and
a photoresist pipeline that connects the nozzle to the photoresist supply,
wherein the nozzle housing includes:
a lower housing including a solvent groove in which the solvent is stored; and
an upper housing on the lower housing,
wherein the upper housing includes:
a nozzle insert hole above the solvent storage groove and configured to receive the nozzle; and
a gas supply hole connected to one side of the nozzle insert hole,
wherein the purge gas supply and the purge gas exhauster are connected to the photoresist pipeline,
wherein the photoresist pipeline includes:
an external line; and
an internal line in the external line,
wherein the purge gas supply provides the purge gas to a gap between an inner wall of the external line and an outer wall of the internal line,
wherein the photoresist pipeline further includes a filler between the inner wall of the external line and the outer wall of the internal line, the filler with a pore through which the purge gas flows.

2. The spin coater of claim 1, wherein the upper housing further includes a gas discharge hole connected to other side of the nozzle insert hole.

3. The spin coater of claim 2, wherein the lower housing further includes:
a solvent supply hole that is below the gas supply hole and is connected to the solvent supply; and
a solvent discharge hole below the gas discharge hole.

4. The spin coater of claim 3, further comprising a solvent discharger that is connected to the solvent discharge hole and discharges the solvent from the solvent storage groove.

5. The spin coater 1, further comprising a first supply line that connects the purge gas supply to the photoresist pipeline,
wherein the first supply line is connected to the external line and is separated from the internal line.

6. The spin coater of claim 1, further comprising:
a purge gas exhauster that exhausts the purge gas from a photoresist pipeline or the nozzle housing; and
a first discharge line that connects the photoresist pipeline to the purge gas exhauster,
wherein a first supply line is connected adjacent to a photoresist supply, and
wherein the first discharge line is connected adjacent to the nozzle.

7. A spin coater, comprising:
a spin chuck that rotates a substrate;
a nozzle that provides a photoresist on the substrate;
a photoresist supply that provides the nozzle with the photoresist; and
a photoresist pipeline that connects the nozzle to the photoresist supply,
wherein the photoresist pipeline includes:
an external line;
an internal line in the external line; and
a filler between an inner wall of the external line and an outer wall of the internal line, the filler containing a purge gas.

8. The spin coater of claim 7, further comprising:
a purge gas supply that supplies the purge gas into the filler in the photoresist pipeline; and
a first supply line connected between the purge gas supply and the photoresist pipeline,
wherein the first supply line is connected to the external line and is separated from the internal line.

9. The spin coater of claim 8, further comprising:
a purge gas exhauster that exhausts the purge gas from the photoresist pipeline; and
a first discharge line that connects the photoresist pipeline to the purge gas exhauster,
wherein the first supply line is connected adjacent to the photoresist supply, and
wherein the first discharge line connected adjacent to the nozzle.

10. The spin coater of claim 7, wherein the filler includes a polyurethane foam resin.

11. The spin coater of claim 7, wherein the external line and the internal line include a fluoropolymer tube.

* * * * *